United States Patent [19]
Stinespring et al.

[11] Patent Number: 5,123,995
[45] Date of Patent: Jun. 23, 1992

[54] LOW-TEMPERATURE, PHOTO-INDUCED EPITAXY

[75] Inventors: Charter D. Stinespring, Arthurdale, W. Va.; Andrew Freedman, Chelmsford, Mass.

[73] Assignee: Aerodyne Research, Inc., Billerica, Mass.

[21] Appl. No.: 592,648

[22] Filed: Oct. 4, 1990

[51] Int. Cl.$^5$ .................................. C30B 25/02
[52] U.S. Cl. ........................ 156/613; 156/DIG. 64; 437/19; 437/81; 437/126; 437/916; 437/936
[58] Field of Search ............... 437/19, 81, 126, 916, 437/936; 156/613; 148/DIG. 64

[56] References Cited

U.S. PATENT DOCUMENTS

| | | | |
|---|---|---|---|
| 3,271,180 | 9/1966 | White | 427/99 |
| 4,340,617 | 7/1982 | Deutsch et al. | 427/53.1 |
| 4,566,918 | 1/1986 | Irvine et al. | 148/175 |
| 4,594,264 | 6/1986 | Jensen | 437/126 |
| 4,659,401 | 4/1987 | Reif et al. | 148/175 |
| 4,804,638 | 2/1989 | Hoke et al. | 148/DIG. 64 |
| 4,830,982 | 5/1989 | Dentai et al. | 437/94 |
| 4,859,625 | 8/1989 | Matsumoto | 437/81 |
| 4,935,383 | 6/1990 | Nouhi et al. | 437/81 |
| 4,950,621 | 8/1990 | Irvine et al. | 437/81 |

OTHER PUBLICATIONS

Foord et al., "Evaluation of the Surface Reactivity of Novel Hydride Adduct Precursor of Al and Ga . . . ", Chemtronics (Dec. 1989) vol. 4, No. 4, pp. 262-264, abstract only.
Poate et al., *Laser Annealing of Semiconductors*, Academic Press, New York, 1982, pp. 388-389.
Tokumitsu et al., J. Appl. Phys., 55(8), pp. 3163-3165, Apr. 15, 1984, USA.
Zinck et al., Appl. Phys. Lett., 52 (17), pp. 1434-1436, Apr. 25, 1988, USA.

*Primary Examiner*—Robert Kunemund
*Attorney, Agent, or Firm*—Cesari and McKenna

[57] ABSTRACT

Disclosed herein is a process for producing a thin film of epitaxial material on a substrate surface at low temperatures under ultrahigh vacuum conditions. In general, precursor compounds are deposited, and converted into the epitaxial material, on the substrate surface at a temperature at which they undergo no substantial dissociation. By way of example, a beam-deposited admixture of dimethyl tellurium and dimethyl cadmium is efficiently converted to an epitaxial cadmium telluride crystal on the surface of a GaAs(100) substrate placed in an ultrahigh vacuum chamber by low power, 193 nm laser irradiation (pulse fluence approximately 6 mJ cm$^{-2}$) at substrate temperature of $-150°$ C. and by subsequent annealing at 200° C. for 30 seconds. In addition to efficient use of precursors, this process also permits considerable improvement of pattern resolution.

51 Claims, 2 Drawing Sheets

LOW-TEMPERATURE, PHOTO-INDUCED EPITAXY

ORIGIN OF THE INVENTION

The Government has rights in this invention pursuant to Contract No. F 49620-88-C-0029 issued by the Air Force Office of Scientific Research (Bolling AFB).

FIELD OF THE INVENTION

This invention relates generally to a photo-induced process for growing a thin film of material, and particularly of an epitaxial material, onto the surface of a substrate at low temperature.

BACKGROUND OF THE INVENTION

The growth of a thin film of epitaxial material on a substrate surface is an important step in the fabrication of various electronic devices.

For example, infrared imagers are constructed by processes in which CdTe crystal formed on a GaAs substrate is used as the substrate for subsequent HgCdTe and HgTe/CdTe superlattice growth. Moreover, II-VI compounds are needed for electronically addressable flat panel display devices and blue laser emitting and injection devices. For applications in the blue portion of the visible spectrum, ZnSe and ZnS have long been favored candidates.

In addition, a new class of materials called diluted magnetic semiconductors (DMS) have currently received considerable attention. DMS are II-VI semiconductors such as CdTe or ZnSe with a fraction of the Group II element replaced by a magnetic transition element such as manganese. The incorporation of manganese leads to very large magnetooptic effects, on the order of several hundred times those exhibited by conventional semiconductors of a comparable bandgap.

Vapor phase epitaxy (VPE) and molecular beam epitaxy (MBE) are two techniques well known in the art for crystal growth of thin film materials. In VPE, the substrate to be coated is exposed to a vapor containing the metals to be deposited. In MBE, the substrate surface is deposited with a directed beam of molecules that contain the metals.

Photolytically or thermally decomposable metalorganic compounds have been used as the metal sources, or precursors, of the thin film material in both VPE and MBE methods. In metalorganic VPE and MBE, as the compounds are deposited on the substrate, the metals in the precursors are freed from the organic constituents, either by thermal dissociation or by photolysis or both, and combine to form an epitaxial thin film material.

Metalorganic VPE has the disadvantage that it tends to waste the rather expensive metalorganic compounds; only a small fraction of the relatively large amount of metalorganic precursors that have to be introduced into a VPE system is deposited on the substrate. MBE systems are much more efficient than VPE systems in that regard, but the amount of molecules that actually "stick" to the substrate surface still tends to be only a small percentage of the molecules that strike it.

In both metalorganic VPE and MBE, a patterned thin film of epitaxial material can be deposited onto a substrate surface by selected photolysis of the metalorganic compounds. Employment of laser irradiation to induce photolysis has greatly improved the resolution of patterned deposition, but such resolution still has been limited so far.

SUMMARY OF THE INVENTION

According to the present invention, which deposits precursor compounds on a substrate surface for formation of epitaxial material, we separate the deposition step from the subsequent steps, i.e., fixation of the deposited precursors and crystallization thereof. This allows for individual optimization of each step.

This separation provides several useful properties for the process described herein. First, efficient deposition of precursor molecules is realized due to the elimination of temperature constraints which are typically required to induce chemical decomposition and subsequent epitaxial growth. Second, photolytic pattern projection with high resolution is possible due to the elimination of gaseous precursor species before irradiation. Resolution in high pressure systems is typically limited by gas phase diffusion of photoproducts to the surface. Third, in combination with annealing the deposited film to produce epitaxial ordering, a self-limiting, layer-by-layer deposition process can be realized.

As an example which covers these aspects of the present invention, photolyzable precursor compounds are first deposited on the substrate surface, typically by beam-depositing as in the conventional MBE methods. The deposition is performed at temperatures at which the compounds do not undergo thermal dissociation or epitaxial crystallization, thereby separating precursor deposition from the subsequent operations. Such temperatures usually are low enough that the sticking coefficients of the precursors are relatively high. The result is very effective precursor adsorption by the substrate surface at this stage, but essentially no epitaxial crystallization.

After a layer of the photolyzable precursors with a predetermined thickness has efficiently been deposited on the substrate surface, selected areas of the deposition layer are then converted into metallic material by photolysis preferably after evacuation of the chamber to reduce the concentration of unadsorbed precursors. Resolution of a pattern thus formed is reasonably fine, since no gaseous products which can diffuse to the substrate are produced in the photolysis step. In addition, at low substrate temperatures, surface species diffusion is minimized. The metallic material may be further subjected to annealing to remove any contaminants and produce epitaxial ordering, if necessary. Also, the deposited, yet unphotolyzed, precursors can be easily removed by heating the substrate to a predetermined temperature.

BRIEF DESCRIPTION OF THE DRAWINGS

The present invention may be better understood by referring to the following description in conjunction with the accompanying drawings, in which.

DETAILED DESCRIPTION OF ILLUSTRATIVE EMBODIMENTS

Figure 1:
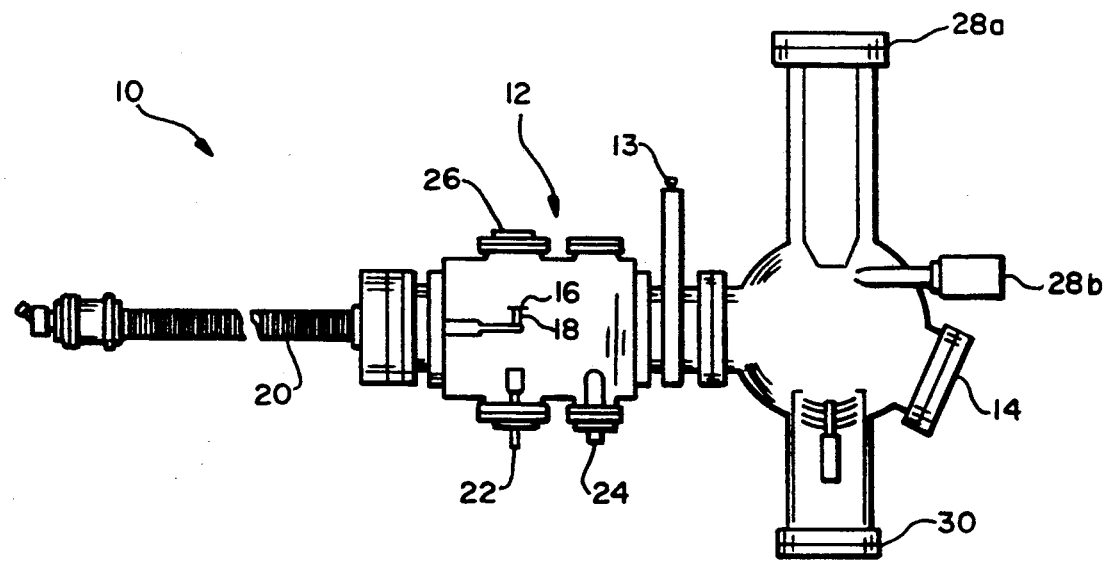
FIG. 1 is a diagrammatic plan view of an apparatus for carrying out the epitaxial growth of II-VI material according to the present invention.

FIG. 1 depicts an epitaxial system, designated by numeral 10, for carrying out the epitaxial growth of a single crystal thin film on the surface of a substrate.

In general, the epitaxial system 10 comprises a reaction chamber 12 and an analysis chamber 14. In the reaction chamber 12, a substrate crystal 16, onto whose surface an epitaxial material is to be formed, is first cooled to a predetermined temperature, as will be discussed in detail below. An effusive molecular beam doser 22 then directs at the surface of the substrate 16 photo-decomposable metalorganic precursors, a high percentage of which stick to the surface because of its low temperature. Once the precursors have been adsorbed by the substrate surface to form a coverage of a desired thickness, the surface is irradiated with light through a UV window 26 and the precursors thereon are decomposed and converted into metallic material. If necessary, the substrate 16 can be heated up to thermally anneal the thin film thus formed, thereby producing epitaxial ordering.

The chemical and physical properties of the deposited precursors, both before and after irradiation or annealing, can be determined in the analysis chamber 14. Further, the reaction chamber 12 is equipped with a turbomolecular pump with a liquid nitrogen trap, which enables the chamber 12 to achieve ultrahigh vacuum (UHV) conditions. It is preferable to evacuate the reaction chamber 12 using the turbomolecular pump prior to introduction of precursors into the chamber 12. This will minimize any contamination to the thin film material to be formed. It is also preferable to irradiate in vacuo the deposited precursors. The analysis chamber 14, on the other hand, is provided with an ion/sublimation UHV pump.

Set forth below is a more detailed description of the epitaxial system 10 and its operation.

The two chambers 12, 14 are directly connected to each other via a gate valve 13. The substrate crystal 16 is mounted on a support means 18 disposed in the reaction chamber 12. The substrate 16 can be transferred between the chambers 12 and 14 using a linear feed through device 20. More specifically, the feedthrough device 20 is capable of moving the substrate 16 linearly back and forth within the reaction and analysis chambers 12, 14 and positioning it at any desired angle, so that the subs&:rate 16 can be subjected to various treatments and analyses. In addition, the feedthrough device 20 used in this embodiment of the invention is also capable of heating the substrate 16 to over 900° C. and cooling the same down to −150° C.

The reaction chamber 12 is further provided with an ion gun 24, which is used to clean the surface of the substrate 16 in situ before the deposition step is begun.

The UV window 26 permits a laser beam to pass into the reaction chamber 12 to reach the surface of the substrate 16. Also provided is a pulsed excimer laser (not shown) capable of emitting lights of 193 nm, 351 nm and other discrete wavelengths, respectively. The laser fluence, which is controlled by a simple beam expander, ranges from 0.3 mJ cm$^{-2}$ to 20 mJ cm$^{31\ 2}$.

To monitor the epitaxy process at different stages, the analysis chamber 14 is equipped with an X-ray photoelectron spectroscope (XPS) 28a and 28b, as well as the low-energy electron diffraction analyzer (LEED) 30. The XPS analyses are performed by using both a Physical Electronics Inc. (PHI) 15 kV, Mg K$_A$ source 28a and a PHI double pass cylindrical mirror electron energy analyzer 28b operated at a pass energy of 25 eV. The analyzer 28b is calibrated using the Au $4f_{7/2}$ peak at 83.8 eV. All spectra are referenced to the Ga $3d_{5/2}$ peak at 18.9 eV. No charging effects are observed except in the limit of very thick films, i.e., greater than 200 Å. The XPS provides a determination of both the chemical state and coverage of the adsorbed molecular species on the surface of a substrate. The LEED, on the other hand, provides information regarding the epitaxial ordering of a crystal.

According to one embodiment of the present invention, two metalorganic compounds, dimethyl cadmium (DMCd) and dimethyl tellurium (DMTe), are introduced into the epitaxial system 10 as precursors for formation of an epitaxial CdTe thin film on a GaAs(100) substrate 16 (see FIG. 1). The two precursors are preferably purified by means of a series of freeze-thaw cycles. The GaAs(100) substrate 16 is a p-type electronic-grade, single-crystal substrate.

Both DMCd and DMTe are known to undergo single-photon dissociation to produce ground state metal atoms in response to 193 nm irradiation [e.g., C. F. Ye et al. *J. Chem. Phys.* 85:1382 (1986); C. J. Chen et al. *J. Chem. Phys.* 81:327 (1984); and, M. Stuke, *Appl. Phys. Lett.*, 45:1175]. Thus, the DMCd/DMTe admixture, i.e., the DMCd/DMTe mixture adsorbed by the surface, is irradiated with 193 nm light for their decomposition and subsequent conversion into CdTe.

In order to produce an epitaxial CdTe thin film on a substrate surface, it is important that the adsorbed DMCd and DMTe, before they are induced to form CdTe, not undergo thermal dissociation and also not interact strongly with the GaAs surface. Thus, the process must be performed at a temperature low enough that such dissociation or interaction does not occur.

We have demonstrated that when DMTe is deposited on a GaAs substrate surface at a temperature about or below −135° C., the characteristic Te peak does not shift as the adspecies coverage increases from sub-monolayer to multilayer coverage, indicating that DMTe does not strongly interact with the GaAs surface. On the other hand, at a temperature about or below −135° C., the Cd peak from DMCd molecules on a GaAs surface, shifts to higher binding energy as the DMCd coverage increases, indicating a GaAs surface-induced shift to low binding energy for Cd electrons. However, this surface-induced effect is found to be minimal when the thickness of the coverage reaches about 25 Å. No thermal dissociation takes place for either metalorganic molecule at a temperature about or below −135° C.

Further, DMCd and DMTe molecules have relatively high sticking coefficients at −135° C., and as a result, can be efficiently adsorbed by the surface of substrate 16. More specifically, the sticking coefficients of DMCd and DMTe increase to the range of 0.1 to 0.3, which is about two to three orders of magnitude greater than that found at typical growth temperature, i.e., about 200° C. to 300° C. In other words, one can use these expensive metalorganic precursors 100 to 1000 times more efficiently at temperatures about or below −135° C.

As the first step of the process in accordance with this embodiment, the GaAs substrate surface, on which an epitaxial CdTe is to be formed, is cleaned by Ar+ ions by means of the ion gun 24. Typically, the substrate 16 is cleaned by Ar+ ion etching at 1 kV until no trace of oxygen contamination can be observed. It is then annealed at 577° C. to remove ion-induced damage and restore surface order, as observed by means of a low-energy electron diffraction analyzer (LEED) 30 which is disposed in the analysis chamber 14.

Both the reaction chamber 12 and the analysis chamber 14 are preferably evacuated to achieve a vacuum, e.g., about $3 \times 10^{-9}$ torr, before deposition. Meanwhile, the substrate is cooled to and maintained at −135° C. or below. The cleaned surface of the substrate 16 is then beam-deposited by means of the molecular doser 22 with a mixture of DMCd and DMTe, with a ratio of DMCd to DMTe of about 0.5 to 2.0. For the substrate-doser geometry used in this embodiment, the angular distribution of the effusive beam is preferably such as to produce only a nominal 10% variation in exposure over the area of the substrate surface to be analyzed in the analysis chamber 14.

When the admixture coverage reaches a desired thickness, the reaction chamber 12 is evacuated again to achieve an ultrahigh vacuum. Once the unadsorbed precursors are substantially removed, the surface coverage is irradiated with 193 nm pulses produced by an excimer laser using low power, e.g., a fluence of 6 mJ cm$^{-2}$ for each pulse. 150 pulses are then applied to initiate a chemical reaction between DMCd and DMTe to form a thin film of CdTe.

Finally, the CdTe film thus formed, which contains carbon contaminants, is annealed at a sufficiently high temperature, e.g., 200°, for a sufficient period of time, e.g., 20 minutes, to reduce the carbon contaminants and to produce epitaxial ordering.

The thickness of the admixture coverage is determined by XPS by ratioing the absolute intensities of the spectral peaks of the substrate before and after deposition. Using published attenuation factors, the thickness can be derived. After the surface of a substrate 16 has been exposed to the DMCd/DMTe mixture for a given period of time, the turbomolecular pump is used again to evacuate the reaction chamber 12 and thus reduces the concentration of the unadsorbed mixture. The substrate 16 is transferred in vacuo to the analysis chamber 14 for analysis by means of XPS. Following the XPS analysis, the substrate 16 is returned t o the reaction chamber 12 for more exposure to the mixture if the coverage is not of desired thickness. The exposure/analysis cycle can be repeated as many times as necessary.

Figure 2:
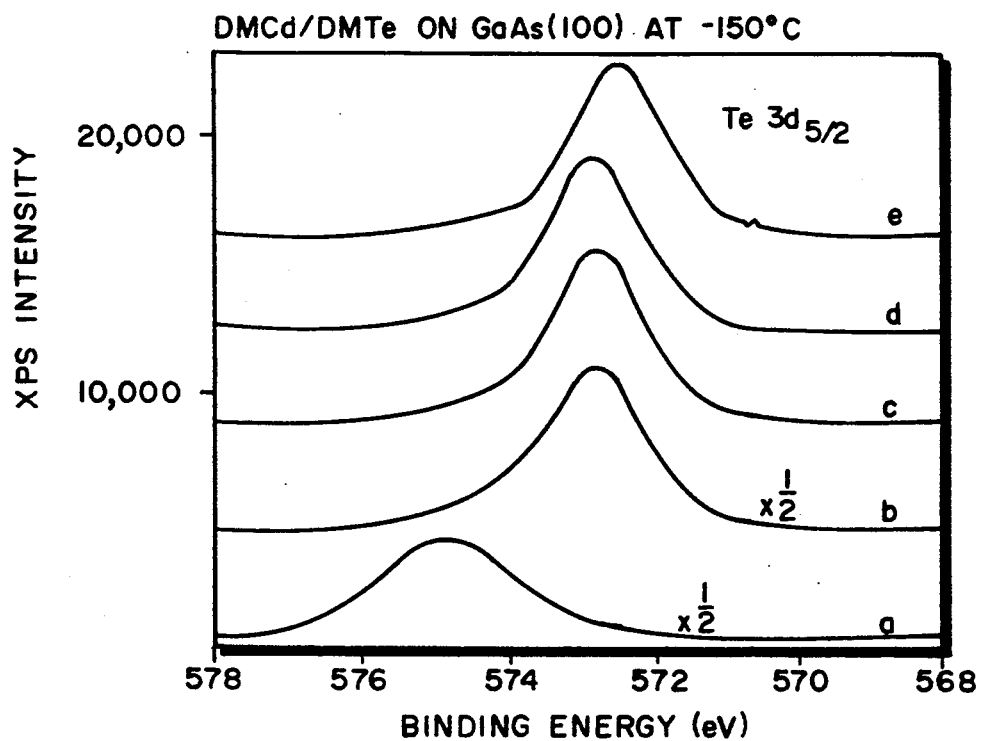
FIG. 2 shows X-ray photoelectron spectroscopy (XPS) spectra of the Te $3d_{5/2}$ peak of an approximately 100 Å thick film of a dimethyl tellurium (DMTe)/dimethyl cadmium (DMCd) mixture adsorbed on a GaAs(100) substrate at $-150°$ C. as a function of the number of 193 nm laser pulses at 6 mJ cm$^{-2}$ except for the top spectrum, which is the result for the laser-irradiated film after thermal annealing at 200° C. for 20 minutes.

FIG. 2 shows the results of an illustrative, non-limiting working example, which demonstrates the practice and advantages of the present invention. In this example, the adspecies on a GaAs substrate were analyzed at different stages during the above-described epitaxial growth process. More specifically, FIG. 2 shows XPS spectra of the Te $3d_{5/2}$ peak of an approximately, 100 Å thick film of a DMTe/DMCd admixture on a GaAs(100) substrate at −150° C. as a function of the number of 193 nm laser pulses at 6 mJ cm$^{-2}$ Detailed procedures followed in this working example are as follows.

The approximately 100 Å thick admixture film formed in the reaction chamber 12 was first subjected to an XPS analysis in the analysis chamber 14 without any irradiation. It was then transferred back to the reaction chamber 12 and irradiated for 150 laser pulses ($9 \times 10^{17}$ photons total dose), followed by another XPS analysis in the analysis chamber 14. After the analysis, the substrate 16 was returned to the reaction chamber 12 where the film was irradiated with another 1000 laser pulses. The film was then analyzed again. The irradiation/analysis cycle was repeated for the third time, with illumination of an additional 5000 pulses. Spectra a, b, c and d are the results for the film on which 0, 150, 1150 and 6150 laser pulses, respectively, were irradiated. Spectrum e, on the other hand, is the result of subsequent thermal annealing at 200° C. for 30 seconds or longer.

The rather broad spectrum a, which is identifiable as that for tellurium of DMTe, was immediately converted to a narrower peak at a binding energy indicative of metallic tellurium (spectra b, c and d) upon irradiation of laser photons of different dosages. The conversion was independent of the number of laser pulses after more than 150 pulses had been irradiated on the film.

Figure 3:
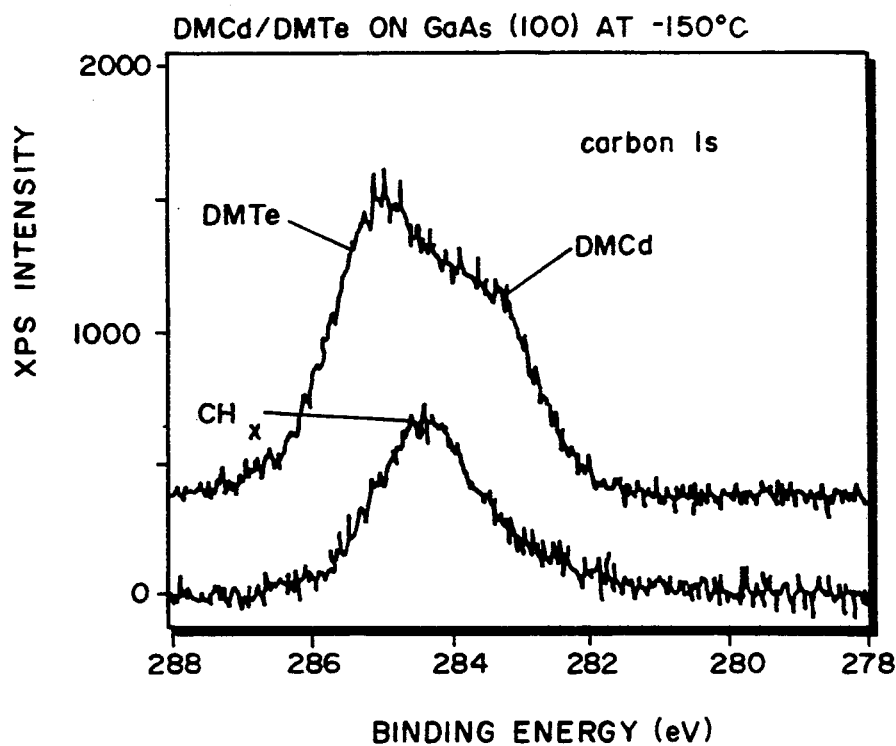
FIG. 3 shows XPS spectra of the C 1s peak of an approximately 100 Å thick film of a DMTe/DMCd mixture adsorbed on a GaAs(100) substrate at −150° C. before and after irradiation by 150 laser pulses of 193 nm photons at 6 mJ cm$^{-2}$; and, FIG. 4 shows XPS spectra of the Te $3d_{5/2}$ peak, upon irradiation of 351 nm and 193 nm laser pulses at 6 mJ Cm$^{-2}$, respectively, on an approximately 100 Å thick film of a DMTe/DMCd mixture adsorbed on a GaAs(100) substrate at −150° C.

The film produced by 193 nm laser irradiation was heavily contaminated with carbon (see FIG. 3 and description thereof). Annealing at 200° C. for twenty minutes reduced carbon levels below detection limits (approximately 0.5%). Upon annealing, we observed a $1 \times 1$ LEED pattern for the CdTe thin film, indicating an epitaxial CdTe surface. This was further confirmed by the XPS analysis. More specifically, the peak of Te $3d_{5/2}$ was found to shift slightly downward to one identifiable as that for CdTe after the thermal annealing (see spectra e of FIG. 2).

In the above-described working example, the Cd $3d_{5/2}$ XPS spectra for the deposited thin film at different stages were also obtained. The results are similar to those for Te $3d_{5/2}$ (not shown).

The C 1s XPS spectra, both before and after irradiation with laser photons, were also studied in the same working example. As shown in FIG. 3, the spectrum for the admixture before irradiation (the top spectrum) has two distinct peaks. One of the peaks is identifiable as carbon from DMTe (higher binding energy) and the other as carbon from DMCd (lower binding energy). Upon irradiation of 150 laser pulses at 193 nm, all the carbon in both DMCd and DMTe was converted to new species (the bottom spectrum), whose binding energy is consistent with hydrocarbon production. The detection of a CH$_x$ peak after laser irradiation indicates that the CdTe film thus formed was contaminated with carbon.

All the results set forth above indicate that the laser irradiation initiated a chemical reaction between the two metal alkyl compounds DMCd and DMTe to form a CdTe film which was contaminated by carbon species. Thermal annealing of the CdTe film removed the contamination and converted the film into an epitaxial CdTe crystal.

As discussed above, the result of the working example shows that irradiating an approximately 100 Å thick DMCd/DMTe admixture of 1:1 molecular ratio with 193 nm light produced a CdTe thin film with a 1:1 stoichiometric ratio. Further studies indicate that as long as the DMCd to DMTe ratios fall within the range of 0.5 to 2.0 stoichiometric CdTe thin films are produced with no excess of one species or the other. In short, the laser irradiation initiated a chemical reaction between the two metalorganic compounds, with any excess being driven off the surface.

Figure 4:
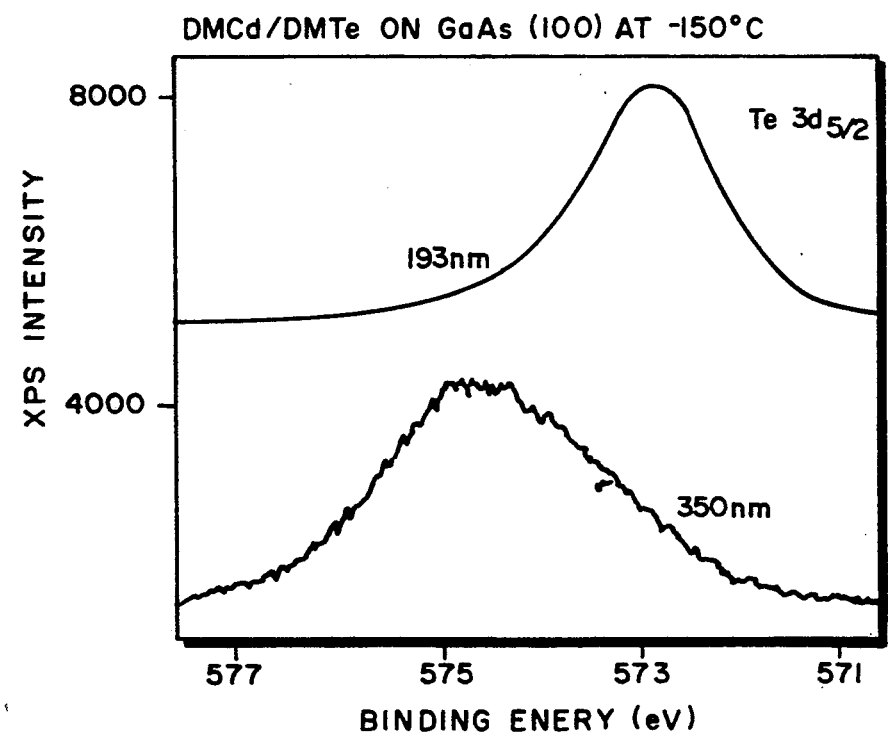

A question arises as to whether the initiation of this chemical reaction is due to the photon-absorption property of the DMCd/DMTe thin film, or just due to substrate heating effects. To answer this question, we irradiated DMCd/DMTe thin films with 6 mJ cm$^{-2}$ pulses at 351 nm. At this wavelength, the thin film should be transparent. FIG. 4 presents the Te $3d_{5/2}$ XPS spectrum of a DMCd/DMTe film which was irradiated with 351 nm laser pulses ($1.5 \times 10^{18}$ photons cm$^{-2}$). Also shown in FIG. 4 is the same XPS spectrum after the film was irradiated with 193 nm laser pulses ($9 \times 10^{17}$ photons cm$^{-2}$). Clearly, the 351 nm laser pulses were not effective in inducing a chemical reaction. Thus the observed results are consistent with the theory that 193 nm photons are absorbed in the thin film to initiate the stoichiometric reaction between DMCd and DMTe. However, whether the reaction is catalyzed by photo-induced electronically excited reactants or free radicals, by increased precursor mobility, or by thermal excitation cannot be deduced from the data.

By way of example, we have demonstrated herein a novel process for growing an epitaxial thin film of CdTe on GaAs(100) by 193 nm laser irradiation of a beam-deposited admixture of DMTe and DMCd at substrate temperatures of $-150°$ C. in an ultrahigh-vacuum chamber and by subsequent thermal annealing at 200° C. for 30 seconds or longer. This process, which is quite efficient at laser fluences of approximately 6 mJ cm$^{-2}$, involves absorption of photons by the DMCd/DMTe admixture to initiate a chemical reaction between the two dimethyl compounds.

According to the present invention, photo-decomposable metalorganic precursors are deposited at a low temperature at which they do not dissociate and do not interact strongly with the substrate surface. As a result, one is able not only to greatly increase the sticking coefficients of the precursors, but also to "freeze" the deposition layer of the precursors.

As discussed above, the increase in the sticking capability results in far more efficient use of the precursors. Freezing the deposition layer, on the other hand, limits the surface mobility of the precursor species and subsequent photoproducts, thereby greatly enhancing resolution when a patterned thin film is to be formed on the substrate surface. Thus, fine resolution can be acquired even with the pattern-mask disposed externally to the reaction chamber. Also, the adsorbed precursors which are not photolyzed can be easily removed by heating the substrate to a temperature at which they spontaneously escape from, while the patterned, metallic material remains on, the substrate surface.

The foregoing description has been limited to a specific embodiment of this invention. It will be apparent, however, that variations and modifications may be made to the invention, with the attainment of some or all of the advantages of the invention.

For example, proper substrate other than III-V crystals may also be used for epitaxial growth of thin film material thereon. By the same token, although DMCd and DMTe are used in the working example to form a thin layer CdTe crystal, one may also employ other metalorganic compounds that are capable of forming a metallic material upon photolysis, such as diethyl tellurium, dimethyl mercury, or trimethyl gallium. In particular, single-element crystal, e.g., Cd, or ternary or quarternary compounds, e.g., $Hg_{1-x}Cd_xTe$, may be prepared in a similar manner.

For obvious reasons, when metalorganic compounds other than DMCd and DMTe are used to from a thin film of epitaxial material, light of wavelengths other than 193 nm may have to be used to irradiate the admixture. In this context, it is to be noted that dimethyl mercury like DMCd and DMTe, also adsorbs 193 nm photons strongly.

Also note that although metalorganic precursors are beam-deposited on the substrate surface in the embodiment disclosed herein, other proper methods for depositing the precursors may also be employed.

Further, pulsed laser annealing may be utilized instead of thermal annealing as the method of removing the carbon contamination and producing epitaxial ordering.

Therefore, it is the object of the appended claims to cover all such variations and modifications as come within the true spirit and scope of the invention.

What is claimed is:

1. A process for growing a thin film material on a substrate surface in a closed chamber, which process comprises the steps of:

evacuating the chamber to achieve a vacuum;

at a temperature at which one or more precursor compounds, which are photolyzable to form the thin film material, undergo no substantial decomposition, beam-depositing the precursor compounds on the substrate surface;

after the depositing step, photolyzing selected portions of the precursor compounds deposited on the substrate surface to form the thin film material in a selected pattern on the substrate surface; and removing the deposited, yet unphotolyzed compounds by heating the substrate to a second temperature, at which the unphotolyzed precursor compounds spontaneously escape from, while the thin film material formed remains on, the substrate surface.

2. The process defined in claim 1, further comprising the step of reducing the concentration of non-deposited precursor compounds in the closed chamber before the photolyzing step.

3. The process as defined in claim 1, wherein the step of removing the deposited, yet unphotolyzed precursor compounds is carried out under vacuum conditions.

4. The process defined in claim 1, wherein the removing step is performed by heating the substrate to a second temperature, at which the unphotolyzed precursor compounds spontaneously escape from, while the thin film material formed remains on, the substrate surface.

5. The process defined in claim 1, further comprising, after the photolyzing step, the step of annealing the thin film material to produce epitaxial ordering.

6. The process defined in claim 1, wherein the compounds are deposited on the substrate surface as a directed molecular beam.

7. The process defined in claim 1, wherein the compounds include a Group II metalorganic compound and a Group VI metalorganic compound, which are photolyzable to form a binary II-VI material.

8. The process defined in claim 7, wherein the Group II metalorganic compound contains cadmium and the Group VI metalorganic compound contains tellurium.

9. The process defined in claim 8, wherein the cadmium-containing compound is selected from the group consisting of dialkyl cadmium compounds and the tellurium-containing compound is selected from the group consisting of dialkyl tellurium compounds.

10. The process defined in claim 9, wherein the dialkyl compound is dimethyl cadmium and the dialkyl compound is dimethyl tellurium.

11. The process defined in claim 10, wherein the substrate is a crystal made of III-V material.

12. The process defined in claim 11, wherein the substrate is a GaAs crystal.

13. The process defined in claim 12, wherein the temperature of the substrate is maintained at about or below $-135°$ C. throughout the deposition and photolyzing steps.

14. The process defined in claim 12, wherein 193 nm light is applied in the photolyzing step.

15. The process defined in claim 12, wherein laser light is used in the photolyzing step.

16. The process defined in claim 12, wherein a laser pulse source is used in the photolyzing step.

17. The process defined in claim 16, wherein 150 laser pulses at about 6 mJ $cm^{-2}$ are applied for photolysis.

18. The process defined in claim 13, wherein the annealing step is performed at about 20° C. for at least 30 seconds.

19. The process defined in claim 12, wherein the molecular ratio of dimethyl cadmium to dimethyl tellurium falls within the range of about 0.5 to about 2.0.

20. The process defined in claim 1, wherein the compounds are deposited on the substrate surface as a directed molecular beam.

21. The process defined in claim 20, wherein the compounds include a Group II metalorganic compound and a Group VI metalorganic compound, which are photolyzable to form a binary II-VI material.

22. The process defined in claim 21, wherein the Group II metalorganic compound contains cadmium and the Group VI metalorganic compound contains tellurium.

23. The process defined in claim 22, wherein the cadmium-containing compound is selected from the group consisting of dialkyl cadmium compounds and the tellurium-containing compound is selected from the group consisting of dialkyl tellurium compounds.

24. The process defined in claim 23, wherein the dialkyl compound is dimethyl cadmium and the dialkyl compound is dimethyl tellurium.

25. The process defined in claim 24, wherein the substrate is a crystal made of III-V material.

26. The process defined in claim 25, wherein the substrate is a GaAs crystal.

27. The process defined in claim 26, wherein the temperature of the substrate is maintained at about or below $-135°$ C. throughout the deposition and photolyzing steps.

28. The process defined in claim 26, wherein 193 nm light is applied in the photolyzing step.

29. The process defined in claim 26, wherein laser light is used in the photolyzing step.

30. The process defined in claim 26, wherein a laser pulse source is used in the photolyzing step.

31. The process defined in claim 30, wherein 150 laser pulses at about 6 mJ $cm^{-2}$ are applied for photolysis.

32. The process defined in claim 21, wherein the annealing step is performed at about 200° C. for at least 30 seconds.

33. The process defined in claim 26, wherein the molecular ratio of dimethyl cadmium to dimethyl tellurium falls within the range of about 0.5 to about 2.0.

34. The process defined in claim 1, further comprising, after the photolyzing step, annealing the thin film material to produce epitaxial ordering.

35. The process defined in claim 34, wherein the compounds are deposited on the substrate surface as a directed molecular beam.

36. A process for growing an epitaxial material on a substrate surface, which process comprises the steps of:
evacuating the chamber to achieve a vacuum;
by beam-deposition, forming on the substrate surface a deposition layer of one or more precursor compounds, which are crystallizable to form the epitaxial material, at a temperature at which the deposition layer undergoes no epitaxial ordering;
reducing the concentration of non-deposited precursor compounds in the chamber;
photolyzing selected portions of the deposited compound, thereby forming a thin film material in a selected pattern on the substrate surface;
raising the temperature of the deposition layer to effect epitaxial ordering; and
removing the deposited, yet unphotolyzed precursor compounds.

37. The process defined in claim 36, wherein the compounds include a Group II metalorganic compound and a Group VI metalorganic compound, which are photolyzable to form a binary II-VI material.

38. The process defined in claim 37, wherein the Group II metalorganic compound contains cadmium and the Group IV metalorganic compound contains tellurium.

39. The process defined in claim 38, wherein the cadmium-containing compound is selected from the group consisting of dialkyl cadmium compounds and the tellurium-containing compound is selected from the group consisting of dialkyl tellurium compounds.

40. The process defined in claim 39, wherein the dialkyl compound is dimethyl cadmium and the dialkyl compound is dimethyl tellurium.

41. The process defined in claim 40, wherein the substrate is a crystal made of III-V material.

42. The process defined in claim 41, wherein the substrate is a GaAs crystal.

43. The process defined in claim 42, wherein the temperature of the substrate is maintained at about or below $-135°$ C. throughout the deposition and photolyzing steps.

44. The process defined in claim 42, wherein 193 nm light is applied in the photolyzing step.

45. The process defined in claim 42, wherein laser light is used in the photolyzing step.

46. The process defined in claim 42, wherein a laser pulse source is used in the photolyzing step.

47. The process defined in claim 46, wherein 150 laser pulses at about 6 mJ $cm^{-2}$ are applied for photolysis.

48. The process defined in claim 42, wherein the annealing step is performed at about 200° C. for about 20 minutes.

49. The process defined in claim 42, wherein the molecular ratio of dimethyl cadmium to dimethyl tellurium falls within the range of about 0.5 to about 2.0.

50. The process defined in claim 36 further comprising, after the photolyzing step, the step of annealing the thin film material to produce epitaxial ordering.

51. A process for growing a thin film material on a substrate surface in a closed chamber, which process comprises the steps of:

at a temperature at which one or more precursor compounds, which are photolyzable to form the thin film material, undergo no substantial decomposition, depositing the precursor compounds on the substrate surface;

reducing the concentration of non-deposited precursor compounds in the closed chamber;

after the depositing step, photolyzing selected portions of the precursor compounds deposited on the substrate, thereby forming a thin film material in a selected pattern on the substrate surface;

removing the deposited, yet unphotolyzed precursor compounds by heating the substrate to a second temperature, at which the unphotolyzed precursor compounds spontaneously escape from, while the thin film material formed remains on, the substrate surface.

* * * * *